United States Patent [19]

Diamond et al.

[11] Patent Number: 5,321,365
[45] Date of Patent: Jun. 14, 1994

[54] REDUCED NOISE SENSITIVITY IN INVERSE SCATTERING THROUGH FILTERING

[75] Inventors: Scott K. Diamond, Beaverton; Steven H. Pepper; Bozidar Janko, both of Portland, all of Oreg.

[73] Assignee: Tektronix, Inc., Wilsonville, Oreg.

[21] Appl. No.: 25,476

[22] Filed: Mar. 3, 1993

[51] Int. Cl.$^5$ ............................................. G01R 31/08
[52] U.S. Cl. ..................................... 324/603; 324/615; 324/618; 324/533; 73/602; 73/597; 364/486; 364/553
[58] Field of Search ............... 364/578, 579, 553, 483, 364/486; 73/602, 597; 342/145; 324/533, 603, 615, 618, 638

[56] References Cited

U.S. PATENT DOCUMENTS

| | | | |
|---|---|---|---|
| 4,475,079 | 10/1984 | Gale | 324/533 |
| 4,491,782 | 1/1985 | Bellis | 324/533 |
| 4,562,540 | 12/1985 | Devaney | 73/602 |

Primary Examiner—Kenneth A. Wieder
Assistant Examiner—Jose M. Solis
Attorney, Agent, or Firm—Francis I. Gray

[57] ABSTRACT

An inverse scattering processing method with enhanced noise immunity and resolution capabilities for use in modeling multi-layer acoustic, electromagnetic or other propagating media. A time bounded filtering step is incorporated within a peeling method for use in processing TDR characteristic waveforms of the propagating media.

11 Claims, 6 Drawing Sheets

REDUCED NOISE SENSITIVITY IN INVERSE SCATTERING THROUGH FILTERING

BACKGROUND OF THE INVENTION

The present invention relates to a method for determining the impedance characteristics of an interconnect or a series of transmission lines as represented by time domain reflectometry (TDR) characteristic waveforms, and more particularly to a method of enhancing the accuracy and resolution for such impedance determinations from TDR waveforms by providing greater immunity to noise.

Transmission lines propagate electromagnetic signals with a given ratio between electric and magnetic fields as defined according to the characteristic impedance of the transmission line. A discontinuity in a transmission line, where one impedance meets another impedance, creates a reflective boundary. An incident electromagnetic signal propagating within the transmission line when meeting the reflective boundary will have a portion of its energy reflected by the discontinuity, the percentage of the incident electromagnetic signal reflected being related to the magnitude of the impedance discontinuity.

With reference to FIG. 1, a TDR waveform 4 reveals the impedance discontinuities of a transmission line. An incident step signal 2 is applied in a forward direction to the input of the transmission line which corresponds to the leading transition 5 of the TDR waveform at time $t=0$. A partial reflection of the incident step returns, at a time subsequent the incident step signal. Transition 6 of the TDR waveform reveals the impedance discontinuity responsible for producing the partially reflected step. The time $T_{rt}$ at which the partially reflected step is received is equal to the round trip time required for the incident step to propagate to and from the discontinuity. The magnitude of the reflected signal with respect to the incident step is related to the magnitude of the impedance discontinuity.

$$\Gamma = \frac{V_{refl}}{V_{in}}$$

$$\Gamma = \frac{Z_1 - Z_0}{Z_1 + Z_0}$$

$\Gamma$ is the reflection coefficient of the discontinuity. $V_{refl}$ is the magnitude of the partially reflected step and $V_{in}$ is the magnitude of the incident step. $Z_0$ and $Z_1$ are the preceding and subsequent characteristic impedances respectively for the transmission line segments defining the impedance discontinuity. A given time interval, time slice, along the time axis of the TDR waveform represents a given segment or layer of the transmission line.

Ideally, the incident step would have an infinite slope for its leading transition; however, real world sources cannot provide such abrupt transitions. Therefore, the incident step which is applied to the transmission line or device under test, DUT, has a finite rise time. With reference to FIG. 2, a DUT having a round trip propagation delay less than the rise time 10 of the associated incident unit step produces a "bump" 12 for the TDR waveform. The bump comprises a series of waveform segments 14, 16 and 17 which span a time interval representative of the round trip propagation delay between first and second impedance discontinuities, associated with the input and output respectively of the DUT, convolved with the leading transition of the incident step signal and multiple reflections thereof. Thus, the resolution for the TDR measurement is limited by the rise time of the incident step signal. In addition, the multiple discontinuities of the DUT make the relationship between the DUT and TDR waveform less intuitive and make it more difficult to extract the impedance levels associated with the DUT.

To obtain an impedance level for a DUT having a short dimension, the DUT s TDR waveform is analyzed in comparison with a reference TDR waveform. Referring to FIG. 2, the reference TDR waveform 13 is generated by applying the incident step signal upon a known discontinuity, e.g. a short, and recording the reference TDR waveform according to the signal produced by the known discontinuity in response to the incident step. After obtaining the reference TDR waveform, the known discontinuity is replaced with the DUT. The incident step signal is applied to the DUT and the signal as produced by the DUT in response to the incident step is measured for obtaining the DUT's TDR waveform 12.

With reference to the example of FIG. 2, the reference TDR waveform 13 has a 200 picosecond rise time associated with the leading transition 10 for the reflected step signal. The 200 picosecond rise time of the reference TDR waveform is much longer than the electrical delay corresponding to the physical length of the device under test, which is a 150 ohm, 25 picosecond long transmission line connected in series between two 50 ohm transmission lines. When the incident step is applied to the DUT, it produces the DUT s TDR waveform bump 12 along the 50 ohm characteristic impedance base line.

It is known to use a peeling algorithm for characterizing the DUT associated with the TDR waveform bump. The peeling algorithm "peels" the DUT layer-by-layer and calculates an impedance for each layer as it "slices" through respective time intervals of the reference TDR waveform and the DUT's TDR waveform, For each slice, the peeling algorithm determines respective amplitudes of the DUT and reference TDR waveforms associated with the given slice and then calculates an impedance for the respective given layer of the DUT according to the two amplitudes.

With reference to FIG. 3, in step 20, the peeling algorithm references the reference TDR waveform with respect to the DUT's TDR waveform and establishes a characteristic impedance level for the baseline of the TDR waveform. In step 22, a new time interval is sliced from the reference and DUT TDR waveforms for determining the impedance level of the next $i^{th}$ layer of the DUT. In step 24, the respective waveform amplitudes are determined for the respective segments of the reference and DUT waveforms within the current time slice and in step 26, an impedance is calculated for the current $i^{th}$ layer of the DUT according to the respective waveform amplitudes determined. In step 28, the DUT and reference TDR waveforms are processed according to the impedance level just calculated for the current, $i^{th}$, layer of the DUT and new reference and DUT TDR waveforms are extracted in preparation for the next, $i+1$, layer of the DUT. The new TDR waveforms represent the incident and reflected signals relative to the interface between the i and $i+1$ layers of the DUT.

The algorithm used for processing the old waveforms and producing the new waveforms is a known, inverse scattering, modified deconvolution algorithm. A. M. Bruckstein and T. Kailpathy, "Inverse Scattering for Discrete Transmission-line Models", 51 AM Rev., 1987, hereby incorporated by reference, which incorporates further explanation of the peeling algorithms, defines such an inverse scattering, modified deconvolution algorithm. When processing slices of the DUT's TDR waveform associate with the characteristic baseline and assuming no noise is present on the reference and DUT TDR waveforms, the inverse scattering, modified deconvolution algorithm produces new TDR waveforms which are identical to the old TDR waveforms with mere time offsets, the time offsets being representative of the propagation delay associated with the given processed layer. However, new TDR waveforms result when the impedance level for the layer just processed differs from the impedance level of the layer immediately preceding, again ignoring the effects of noise.

In step 30, the peeling algorithm determines if the analysis thus far (i.e. accumulation of layers) is sufficient for specifying the length of the DUT. If the algorithm has not sliced through all layers of the DUT, then steps 22 through 30 are repeated until the algorithm has sliced through enough of the TDR waveforms for characterizing the DUT, whereupon the peeling algorithm terminates at step 31.

When noise is present on the DUT and reference TDR waveforms associated with a given layer of the DUT, the peeling algorithm produces an erroneous impedance determination for a given layer of the DUT associated with the noise. Furthermore, because the inverse scattering, modified deconvolution algorithm processes the TDR waveforms according to the impedance levels of preceding layers, the erroneous result of the given layer propagates through the remainder of the peeling algorithm and produces erroneous impedance results for layers of the DUT subsequent the given layer.

The noise present on each of the TDR waveforms comes primarily from two sources: real world instrumentation limitations (i.e., flicker noise, thermal noise, . . . ) and the accumulation of round off errors associated with the inverse scattering, modified deconvolution processing. The inverse scattering, modified deconvolution processing contributes noise to the modified reference and DUT TDR waveforms as the peeling algorithm progresses through the many layers of the DUT. Both noise sources limit the peeling algorithm's ability to accurately characterize the DUT and it is not uncommon to encounter noise magnitudes as large as 1% to 5% with respect to the amplitude of the reference incident step.

One method for reducing the effects of noise upon the peeling algorithm comprises clipping an initial portion of the leading edge of the reference step waveform so that the reference step starts abruptly at some percentage of the final value. FIG. 4 shows a reference unit step with 20% of the leading transition clipped. With 20% clipping, the unit step starts abruptly at a value (0.5) which is 20% of its final value (0.25). With respect to the peeling algorithm of FIG. 3, the clipping step would be inserted between steps 20 and 22 and before the junction associated with the loop feedback path. Although clipping improves the peeling algorithm's immunity to noise, the clipping compromises the peeling algorithm's ability to resolve abrupt impedance discontinuities.

FIG. 5a shows how noise affects the peeled results and FIG. 5b shows how clipping reduces the noise errors. FIG. 5c reveals how clipping, when applied to the processing of ideal waveforms without noise, compromises the results. When the clipping level is too large, it provides such an abrupt transition that it produces a slow exponential 41 instead of an instantaneous 43 convergence for the solution's impedance step, the time constant of the exponential being proportional to the clip value. Furthermore, it may be shown that the shortened transition of the reference step produces an error which propagates through subsequent layers of the DUT's solution to cause residual ringing 45a, 45b.

Thus, the peeling algorithm processes TDR waveforms for extracting impedance levels and modeling transmission lines having multiple reflections and/or dimensions shorter than the stimulus rise time. Noise corrupts the impedance solutions for given layers of the DUT and in turn propagates through the peeling algorithm and corrupts the impedance solutions of subsequent layers of the DUT. Clipping reduces the effects of this noise, but often requires a clipping value so large as to produce residual ringing and compromise the peeling algorithm's ability to resolve abrupt impedance discontinuities.

It is accordingly an object of the present invention to provide an improved TDR measurement technique for providing enhanced resolution and accuracy.

It is another object of the present invention to provide a TDR measurement technique which provides enhanced resolution and accuracy with improved immunity to noise.

It is another object of the present invention to provide a TDR measurement technique enabling the use of smaller clipping values within a peeling process of the measurement technique for assisting the above objectives and reducing residual ringing.

SUMMARY OF THE INVENTION

Accordingly, the present invention provides an improved inverse scattering process for modeling a propagating channel of a DUT in a manner offering improved immunity to noise. A first waveform, representative of an incident signal applied to the channel of a DUT, has a reference amplitude step which is representative of a respective transition of the incident signal. A second waveform is obtained which is representative of the signal produced by the DUT in response to said incident signal. An initial predetermined percentage of the leading transition of the first waveform is clipped from the first waveform so as to produce a clipped waveform. The clipped waveform is then filtered and a model of the propagating channel extracted according to the relationship between the filtered clipped waveform and the second waveform.

In an alternative embodiment of the present invention, the clipped waveform is filtered using a time bounded filtering function which processes the clipped waveform over all epochs except those epochs encompassing the abrupt transition formed by the clipping step, whereupon a model of the propagating channel is extracted according to the relationship between the filtered clipped waveform and the second waveform.

The subject matter of the present invention is particularly pointed out and distinctly claimed in the concluding portion of this specification. However, both the organization and method of operation, together with further advantages and objects thereof, may best be understood by reference to the following description taken in connection with the accompanying drawings wherein like reference characters refer to like elements.

DETAILED DESCRIPTION

Figure 5A:
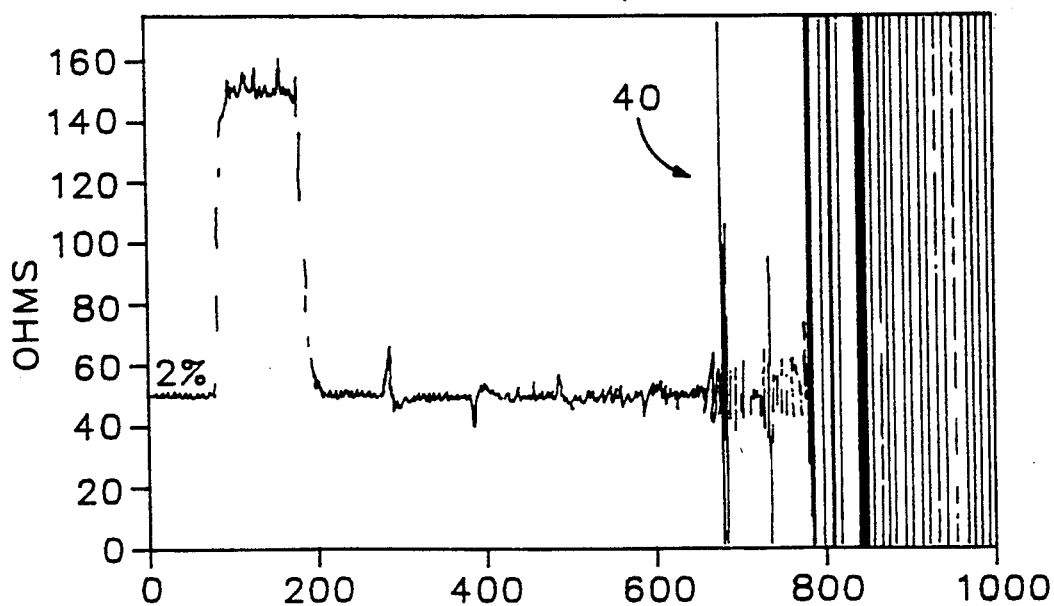
FIG. 5a is a waveform showing results produced using a peeling algorithm with 1% clipping to process noisy reference and DUT TDR waveforms.
Figure 5B:
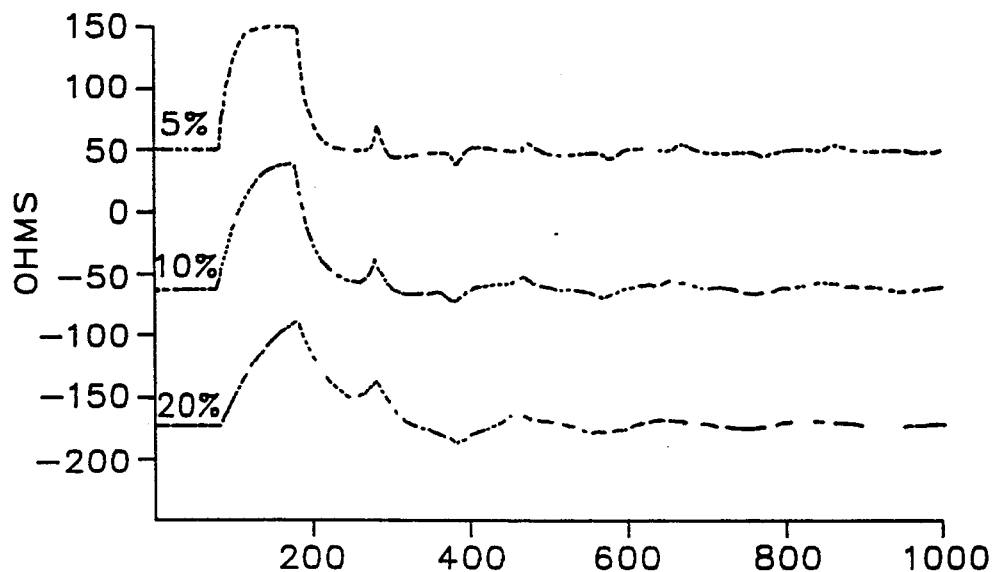
FIG. 5b is a waveform diagram illustrating how clipping reduces noise errors.
Figure 5C:
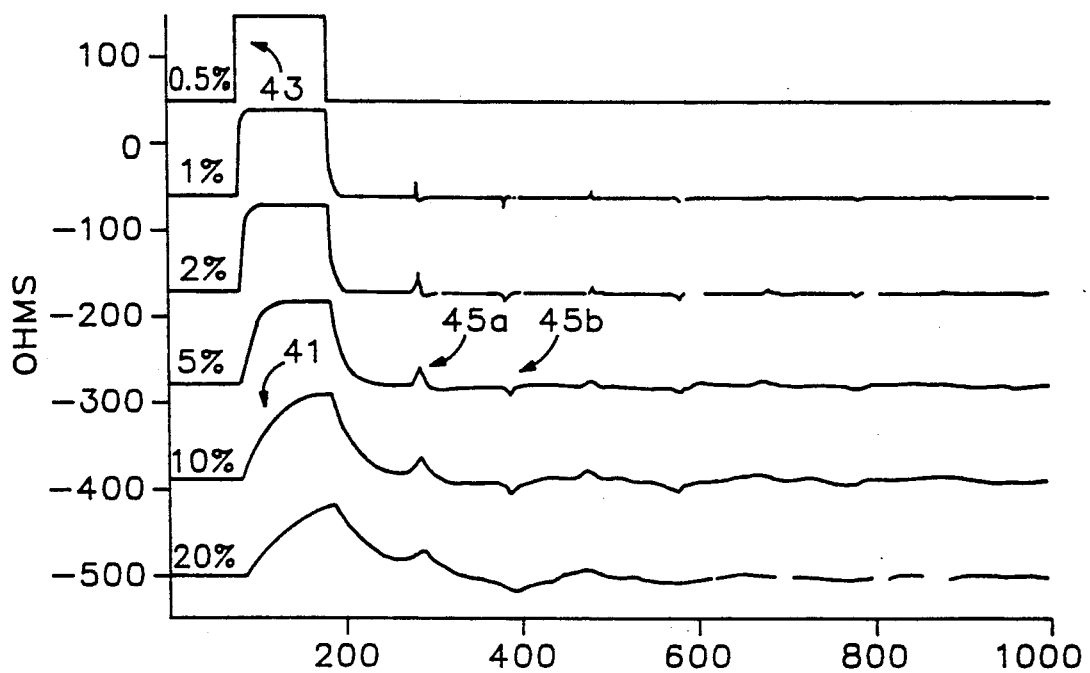
FIG. 5c is a waveform diagram illustrating how clipping affects the impedance results.
Figure 6:
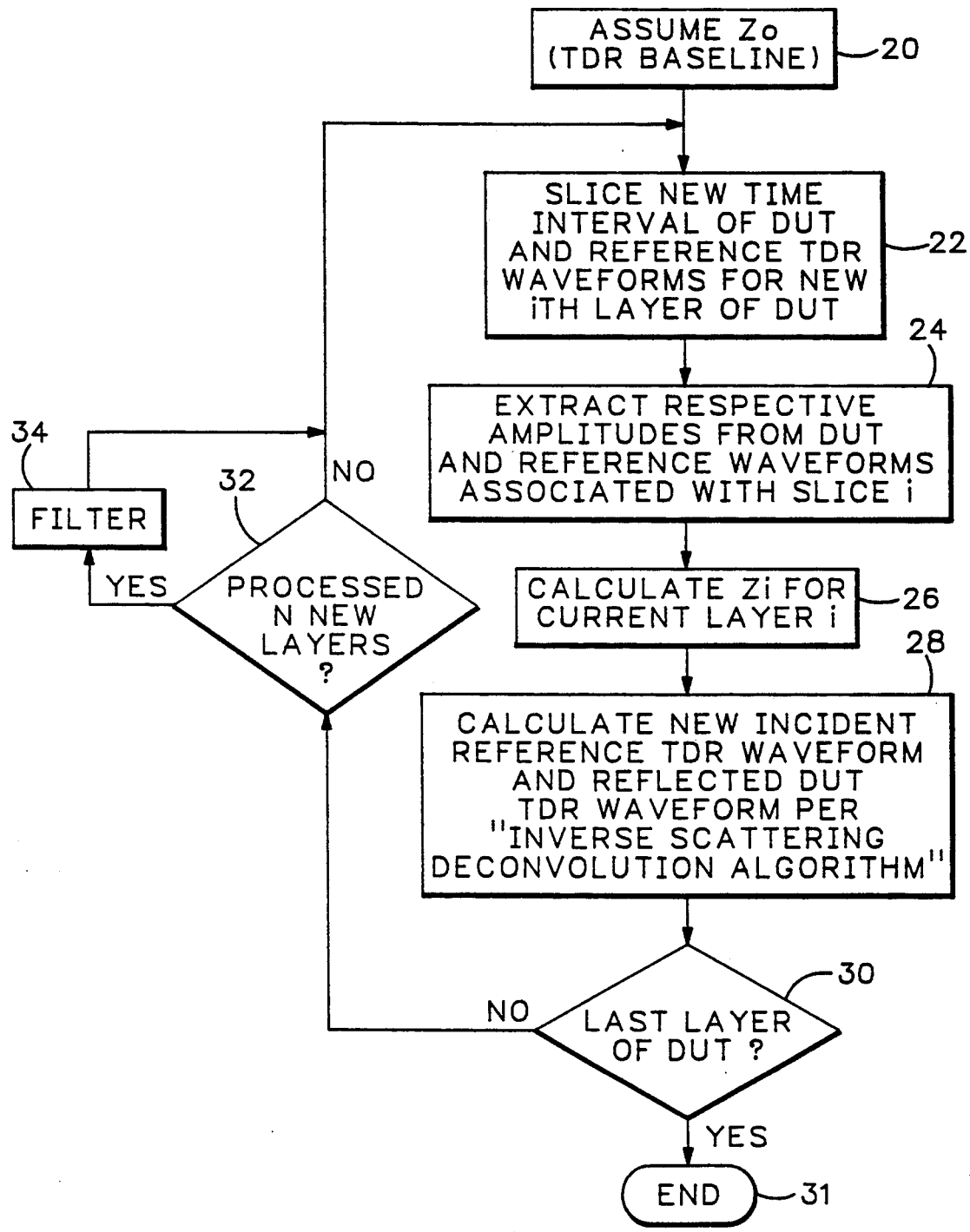
FIG. 6 is a flow chart illustrating the peeling process according to the process of the present invention.

Referring to FIG. 6, the standard peeling method has been modified with the addition of filtering steps 32 and 34 to the feedback path. The peeling method processes data on a layer-by-layer basis with respect to the DUT. Upon calculating an impedance value for a given layer of the DUT, step 28 processes the incident and DUT waveforms according to the inverse scattering modified deconvolution algorithm. Each time step 28 is performed, the resulting waveforms accrue round-off errors which contribute noise to the resulting waveforms in a point-to-point fashion. As the peeling method progresses, the amplitude variations between neighboring time slices build up as the point-to-point noise associated with round-off errors accumulate. Region 40 of FIG. 5a shows how the accumulated noise produces divergent results if the noise amplitude eventually exceeds the clipping value.

The spectral distribution of the point-to-point random round-off noise is related to the inverse of the time interval associated with a given time slice. For example, a time interval of 10 femtoseconds produces a corresponding point-to-point noise spectral distribution of 1/(10 femtoseconds), i.e., 10,000 terahertz. If the application in which this method is used comprises instrumentation with only a 10 gigahertz bandwidth, then the accumulated noise may be filtered by a low pass filter having an effective bandwidth of 10 gigahertz and the resulting point-to-point noise smoothed accordingly.

If the clipped reference waveform were filtered over the entire signal, the sharp edge of the clipped reference waveform would be obscurred and the peeling metod's ability to resolve abrupt impedance discontinuities compromised according to the errors introduced by such. Therefore, in order to provide the peeling method with immunity to noise without obscuring the sharp edge of the clipped reference waveform, the waveform is filtered only on those regions of the waveform which do not include the abrupt clipped transition, i.e., time bounded filtering.

In the preferred embodiment for this modified peeling method, the time bounded smoothing filter smooths the waveform according to the amount of over sampling. Nyquist's sampling criteria requires that the sampling frequency be at least twice that of the maximum frequency associated with the signal being sampled in order to accurately reproduce the signal from the signal samples. If a signal is sampled with a sampling frequency of only twice the maximum frequency of the signal, then a smoothing filter which operates on a plurality of such samples reduces the effective bandwidth and makes reproduction of the original signal impossible. In contrast, if the signal is over sampled, with a sampling frequency greater than twice the maximum frequency of the signal being sampled, then the smoothing filter may operate upon the sampled points with a given smoothing percentage, wherein the maximum percentage of smoothing allowed is related to the amount by which the signal was over sampled.

One embodiment of this invention filters the clipped reference and DUT TDR waveforms between each layer of DUT processing. It may be shown that when so processing the waveforms between each layer of DUT processing, the peeling method loses resolution as it progresses farther into the DUT. Therefore, it is preferred to filter the waveform only when necessary, i.e., before the accumulated noise associated with round-off errors accrues to a level comparable to the clipping value. Step 32 of FIG. 6 controls when the time bounded filtering will be executed and that filtering, step 34, is executed only after every Nth layer of the DUT has been processed, with N being a variable which is set according to the spacing between sampling intervals, the input bandwidth associated with the waveform measurements, and the desired resolution for modeling the device under test so that filtering is accomplished before noise accrues to a level comparable to the clipping value. When N layers of the DUT have been processed, the method progresses to step 34 where the time bounded filtering function processes respective waveforms. In a preferred embodiment, the time bounded low pass filtering is accomplished using a boxcar filter, i.e., as implemented in software. After selectively filtering the waveform, the process returns to the peeling method at step 22 for cutting new slices of respective filtered waveforms.

Accordingly, the present invention periodically executes filtering to confine the accumulation of point-to-point noise and enables a lower clipping value to be used with the peeling method. Furthermore, the present invention uses time bounded filtering which preserves the abrupt edge of the clipped waveform. In this manner, the present invention, with improved immunity to noise, produces solutions having enhanced resolution, improved accuracy and reduced residual ringing.

In an alternative embodiment of the invention, the time bounded filtering utilizes a different type of filtering such as a Butterworth filter.

In another embodiment of the present invention, the peeling process calculates model elements other than transmission line segments, such as equivalent LC values.

The peeling method of the present invention has been described with reference to modeling electrically conductive propagating media. Alternative applications include the modeling of media used for propagating optical electromagnetic energy or acoustic vibrations.

Figure 7:
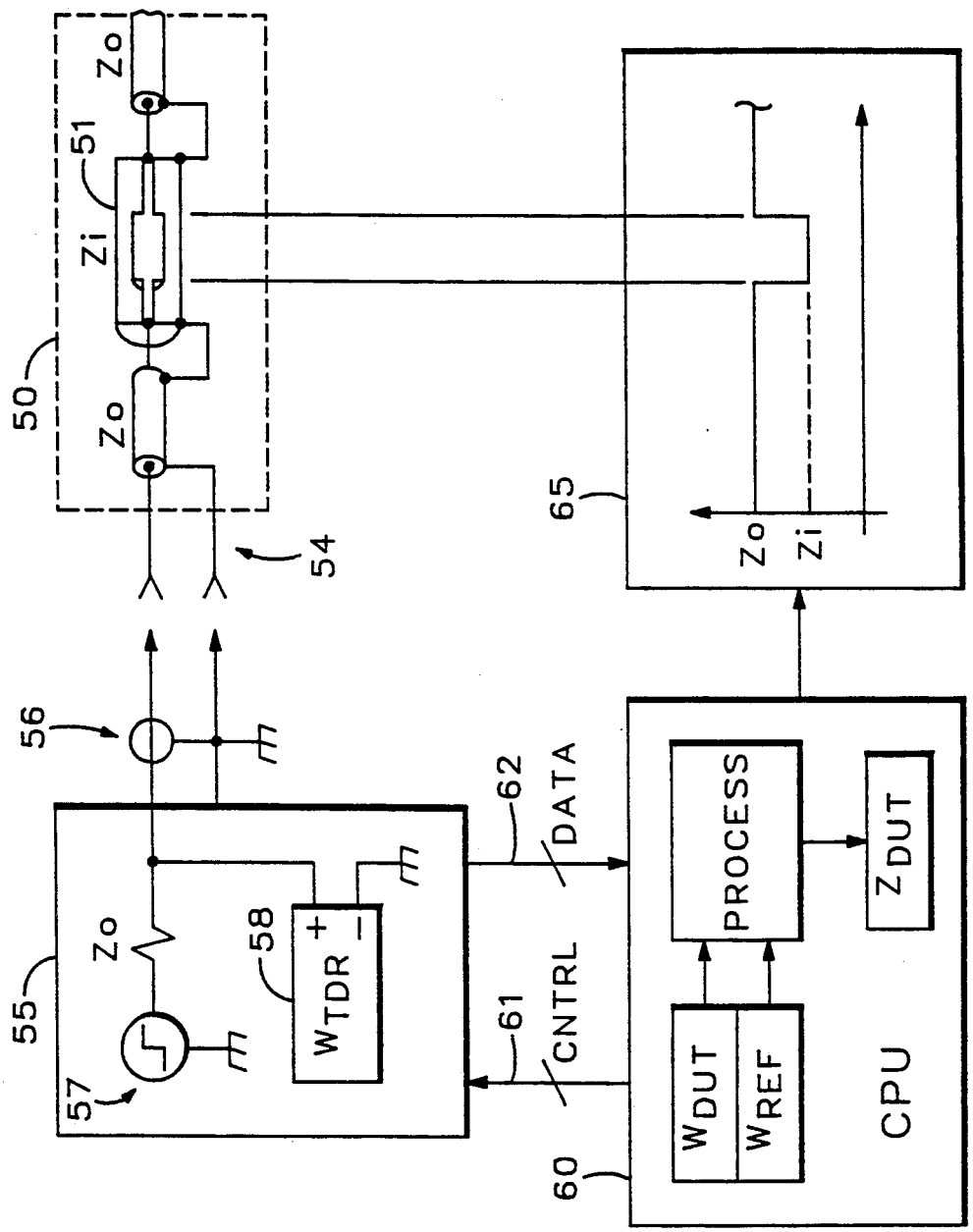
FIG. 7 is a block diagram of a system for carrying out the process of the present invention.

FIG. 7 illustrates a system for carrying out the above process. A DUT 50 has a transition line segment 51 of a characteristic impedance $Z_1$ sandwiched between two other coaxial transmission line segments of a characteristic impedance $Z_0$. An input port 54 of the DUT interfaces with the test port 56 of a TDR instrument 55. The TDR instrument comprises a stimulus source 57 and a waveform measurement and recording block 58. The TDR instrument is interfaced with a CPU 60 which controls the TDR instrument over a control bus 61 and receives data from the TDR instrument over a data bus 62. The CPU sends information out to a display 65 for displaying an equivalent waveform representative of the DUT.

Figure 1:
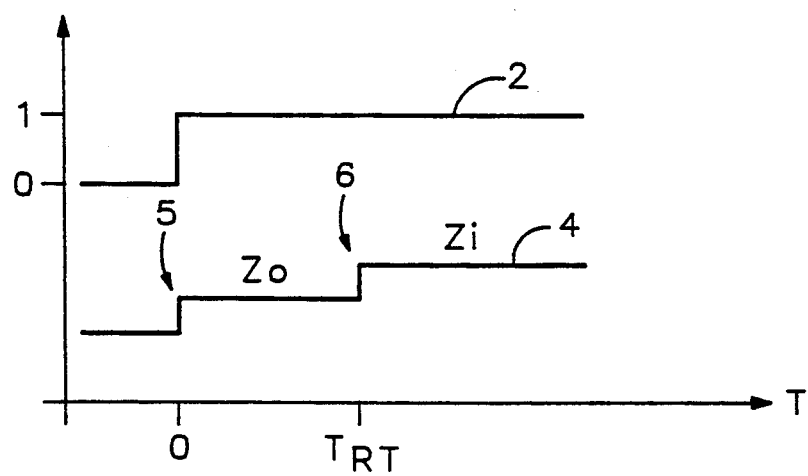
FIG. 1 is a waveform diagram illustrating ideal TDR waveforms.
Figure 2:
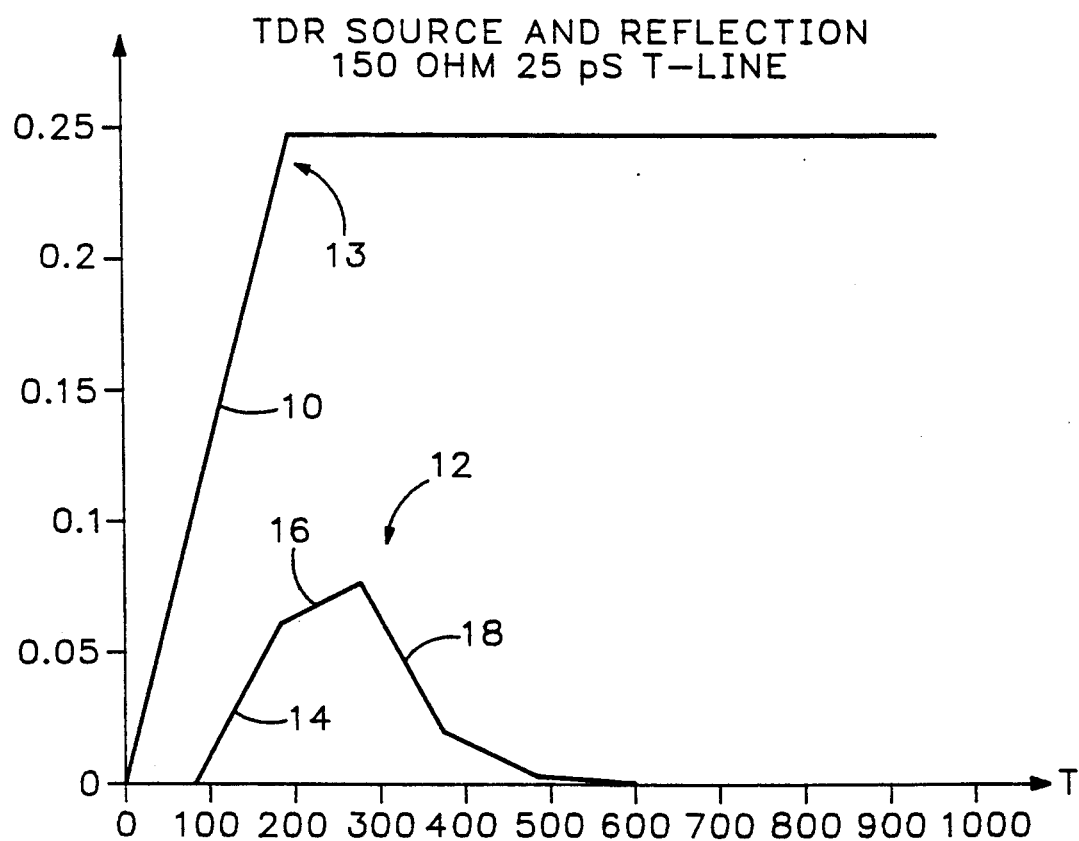
FIG. 2 is a waveform diagram illustrating a reference waveform and a waveform produced by a DUT.
Figure 3:
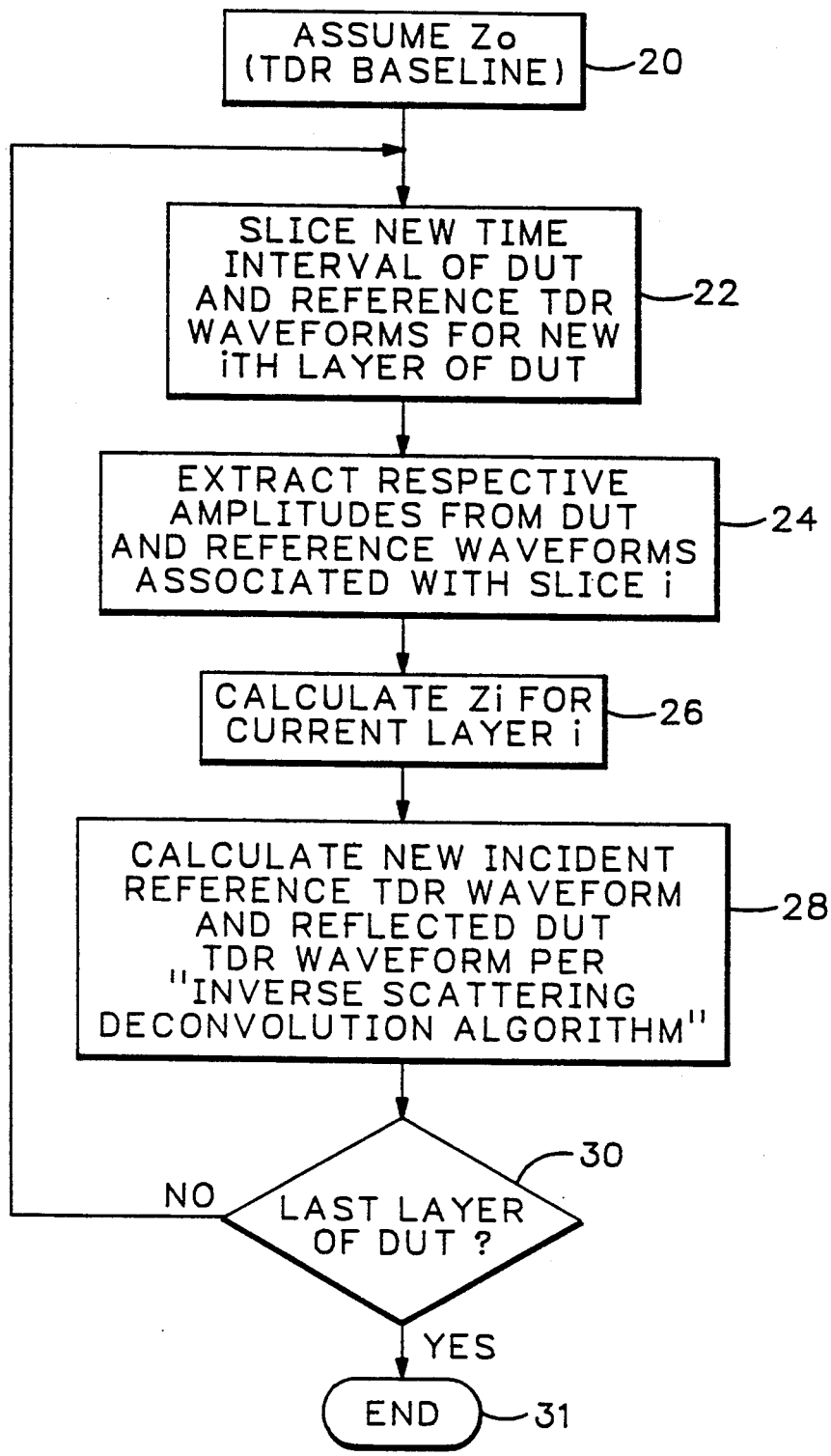
FIG. 3 is a flow chart illustrating the prior art peeling algorithm.
Figure 4:
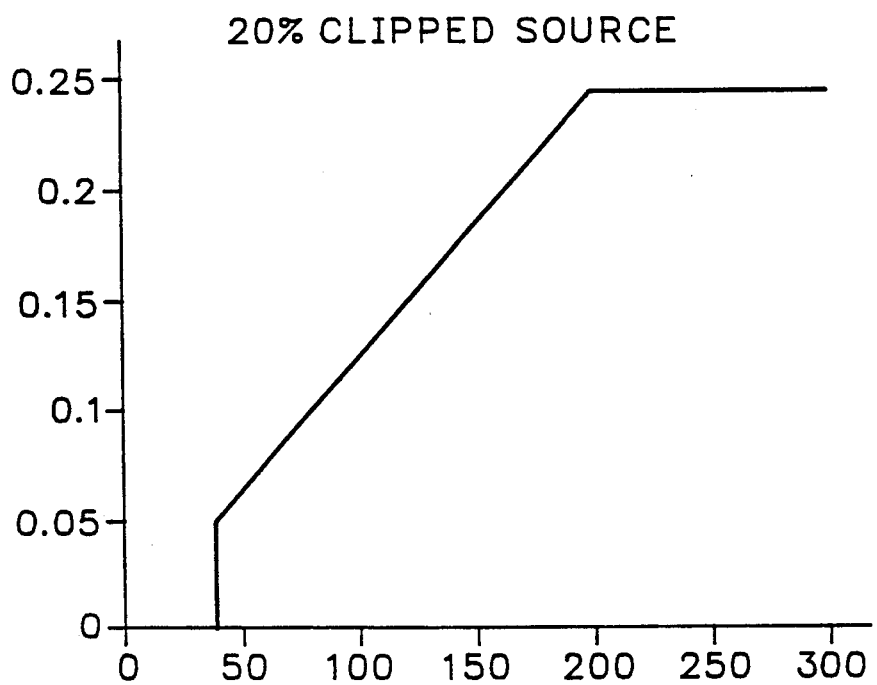
FIG. 4 is a waveform diagram illustrating clipping.

The CPU 60 controls the TDR instrument 55 over bus 61 and commands the TDR instrument to obtain a TDR waveform representative of the DUT. According to the command, the TDR instrument sends out a stimulus signal comprising an amplitude step from the stimulus source 57. The stimulus signal with the amplitude step is applied in a forward direction to the input port 54 of the DUT. Simultaneously, the measurement and recording block 58 records an amplitude versus time waveform representative of the signal produced at the test port 56 of the TDR instrument. The initial voltage of the TDR waveform will correspond to the open circuit voltage amplitude of the amplitude step of the stimulus source divided by two when the initial portion of the DUT, as in this example, is a coaxial transmission line of an impedance $Z_0$ equal to the source impedance of the stimulus source. Thus, the TDR measurement and recording block 58 initially measures and records an amplitude equal to one-half the open circuit amplitude of the amplitude step of the stimulus source. As the amplitude step of the stimulus signal propagates along the DUT, eventually it reaches the impedance discontinuity of the transmission line segment 51. The impedance step from $Z_0$ to $Z_1$ produces a partially reflected signal in response to the amplitude step of the incident stimulus signal. The reflected portion propagates, in a direction opposite the stimulus signal, back to the test port 56 of the TDR instrument where it is eventually received by the measurement and recording block 58. In this manner, the measurement and recording block 58 records a waveform similar to that as previously illustrated with reference to FIG. 2. After recording the TDR waveform, data representative of the DUT's TDR waveform is sent and received by the CPU.

In a corresponding manner, the CPU obtains a reference TDR waveform representative of a TDR signal produced by a known reference termination in the place of the DUT. Once the CPU 60 receives both the DUT TDR waveform and reference TDR waveform, it begins processing the waveforms according to the peeling method of the above process. After the peeling method produces a plurality of model elements corresponding to the respective sliced and processed waveforms, the CPU accumulates the plurality of model elements and combines the model elements in sequential manner to produce an equivalent model of the DUT. Information representative of the equivalent model is then sent to a display terminal for displaying an equivalent waveform diagram representative of the DUT.

While preferred embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An inverse scattering processing method for modeling a propagating channel of a DUT, said method comprising the steps of:
   providing a first waveform having a reference amplitude step and representative of an incident signal received by a given port of the propagating channel of the DUT, said reference amplitude step, having a limited rise time and slope, being representative of a respective transition of the incident signal;
   providing a second waveform representative of the signal produced at the given port of the DUT in response to said incident signal;
   clipping from the first waveform an initial predetermined percentage of the reference amplitude step, thereby producing a clipped waveform having an abrupt transition from the initial amplitude of said first waveform to said predetermined percentage of the reference amplitude step and thereafter corresponding to the first waveform;
   filtering the clipped waveform to produce a filtered clipped waveform, said filtering being conducted by processing the clipped waveform with a predetermined filter; and
   characterizing the propagating channel of the DUT according to the relationship between the filtered clipped waveform and said second waveform.

2. An inverse scattering processing method according to claim 1 wherein said filtering is conducted in a time bounded manner by processing the clipped waveform with said predetermined filter over epochs of the clipped waveform except epochs encompassing said abrupt transition.

3. An inverse scattering processing method according to claim 2 further comprising between the clipping and filtering steps, the steps of:
   dividing the clipped and second waveforms into a plurality of time interval slices representative of a corresponding plurality of layers of the DUT;
   determining a first reflection coefficient according to the amplitude ratios between the respective clipped and second waveform sections associated with a first, current, slice of said plurality of time interval slices;
   determining, according to said first reflection coefficient, a first model for the first, current, layer of the DUT corresponding to said first time interval slice; and
   processing the clipped and second waveforms according to the first model for the current layer of the DUT and a model of a layer preceding the current layer of the DUT so as to provide modified clipped and modified second waveforms as said clipped and second waveforms representative of the respective signals applied and produced in response thereto at the next layer of the DUT;
   wherein said characterization step comprises repeating the steps of determining a reflection coefficient, determining a model, processing and filtering for the second and subsequent time interval slices of said plurality of time interval slices until obtaining corresponding models for all layers of the DUT.

4. An inverse scattering method according to claim 3 wherein the filtering step further comprises processing the second waveform with said predetermined filter over epochs of the second waveform except those epochs corresponding to the epoch of the clipped waveform containing the abrupt transition for producing a filtered second waveform as said second waveform for the next time interval slice.

5. An inverse scattering method according to claim 3 wherein the filtering step is limited to being performed only after every Nth layer of the DUT has been processed, wherein N is an integer greater than one.

6. An inverse scattering method according to claim 2 further comprising the preliminary steps of:
applying said incident signal to a known termination network;
measuring the signal produced by the known termination network in response to said transition of the incident signal;
recording as said first waveform provided, the amplitude with respect to time of said measured signal produced by the known termination;
applying said incident signal to said given port of the DUT;
measuring the signal produced by the DUT at the given port of the DUT in response to the transition of the incident signal; and
recording as said second waveform provided, the amplitude with respect to time of said measured signal produced by the DUT.

7. An inverse scattering method according to claim 3 wherein the model for each layer of the DUT comprises a transmission line segment having a length representative of the corresponding time interval slice.

8. An inverse scattering method according to claim 3 further comprising the additional step of displaying an equivalent diagram of the propagating channel of the DUT, said equivalent diagram being representative of a sequential combination of said plurality of models.

9. An inverse scattering processing method according to claim 1 further comprising between the clipping and filtering steps, the steps of:
dividing the clipped and second waveforms into a plurality of time interval slices representative of a corresponding plurality of layers of the DUT;
determining a first reflection coefficient according to the amplitude ratios between the respective clipped and second waveform sections associated with a first, current, slice of said plurality of time interval slices;
determining according to said first reflection coefficient a first model for the first, current, layer of the DUT corresponding to said first time interval slice; and
processing the clipped and second waveforms according to the first model for the current layer of the DUT and a model of a layer preceding the current layer of the DUT so as to provide modified clipped and modified second waveforms as said clipped and second waveforms representative of the respective signals applied and produced in response thereto at the next layer of the DUT;
wherein said characterization step comprises repeating the steps of determining a reflection coefficient, determining a model, processing and filtering for the second and subsequent time interval slices of said plurality of time interval slices until obtaining corresponding models for all layers of the DUT.

10. An inverse scattering method according to claim 9 wherein the filtering step is limited to being performed only after every Nth layer of the DUT has been processed, wherein N is an integer.

11. An inverse scattering method according to claim 1 further comprising the preliminary steps of:
applying said incident signal to a known termination network;
measuring the signal produced by the known termination network in response to said transition of the incident signal;
recording as said first waveform provided, the amplitude with respect to time of said measured signal produced by the known termination;
applying said incident signal to said given port of the DUT;
measuring the signal produced by the DUT at the given port of the DUT in response to the transition of the incident signal; and
recording as said second waveform provided, the amplitude with respect to time of said measured signal produced by the DUT.

* * * * *